United States Patent [19]

Rote

[11] 3,893,409

[45] July 8, 1975

[54] APPARATUS FOR SOLDER COATING PRINTED CIRCUIT BOARDS

[75] Inventor: Everett Arthur Rote, Corona, Calif.

[73] Assignee: Xerox Corporation, Stamford, Conn.

[22] Filed: Dec. 1, 1972

[21] Appl. No.: 311,206

[52] U.S. Cl. .................... 118/56; 118/74; 118/304; 118/316; 118/402

[51] Int. Cl. .......................................... B05c 11/12

[58] Field of Search ......... 118/56, 402, 57, 403, 73, 118/74, 304, 316, 425, 426; 228/33, 36, 38; 134/199

[56] References Cited

UNITED STATES PATENTS

| | | | |
|---|---|---|---|
| 2,629,885 | 3/1953 | Taylor | 118/316 X |
| 3,190,527 | 6/1965 | Tardoskegyi | 118/403 X |
| 3,491,779 | 1/1970 | McLain et al. | 134/104 |
| 3,498,303 | 3/1970 | Eaves et al. | 134/105 X |
| 3,661,638 | 5/1972 | Lemecha | 118/57 X |
| 3,699,919 | 10/1972 | Coffman | 118/56 |
| 3,724,418 | 4/1973 | McLain | 118/74 X |

*Primary Examiner*—John P. McIntosh
*Attorney, Agent, or Firm*—James J. Ralabate; Franklyn C. Weiss; Anthony J. Sarli

[57] ABSTRACT

Apparatus for obtaining a thick, uniform coating of solder on selected areas of a printed circuit board in which the circuit board, after being exposed to a spray of liquid solder, is immersed in a pool of hot liquid wax or oil, and then vibrated in an orbital motion for a time sufficient to produce flowability of the solder. The orbital motion may be circular or elliptical and may be continued while the circuit board is being withdrawn from the pool. The temperature of the pool of liquid is substantially above the melting temperature of the solder, and the liquid solder for the spray is continuously circulating.

19 Claims, 7 Drawing Figures

APPARATUS FOR SOLDER COATING PRINTED CIRCUIT BOARDS

BACKGROUND OF THE INVENTION

In the manufacture of printed circuit boards a conductive foil, frequently copper, is bonded to an insulating substrate and a film of photoresponsive material is then placed in overlying relationship with the conductive foil. Thereafter, a predetermined circuit pattern is optically projected onto the photoresponsive material to activate areas of the photoresponsive material in accordance with a desired pattern. Next, the insulating substrate with the conductive foil and activated film material thereon are subjected to an etchant material to remove the copper foil and the film material in the unactivated areas. The film material and etchant are such that the film and copper in the activated areas of the film are unaffected while in the unactivated areas the film and copper are chemically removed from the substrate. Thereafter, the substrate is subjected to solvent material which removes the photoresponsive material overlying the copper circuit pattern but which does not adversely affect the copper circuit pattern.

Thereafter the circuit board may be subjected to a drilling operation to form holes through the substrate which ultimately may be utilized to conductively connect portions of the conductive foil on one side of the substrate with portions of the conductive foil on the other side of the substrate according to a predetermined design. Thereafter, the circuit board may be subjected to an electro or electroless plating process to form a conductive connection through the holds between opposite conductive foil patterns.

Because a substantial time period may transpire between the time at which the manufacture of a circuit board is completed and the time at which the particular circuit components are attached and soldered to the circuit board and the board is ultimately utilized in its intended function, a substantial amount of oxidation of the conductive foil can occur, thus affecting conductivity and solderability. In order to overcome this undesirable characteristic, the useful shelf life between the manufacture and utilization periods has been extended by subjecting the conductive foil to a plating process whereby a selected one of the rare inert conductive metals is plated over the conductive foil to prevent subsequent oxidation. While this approach has been effective in many instances, it is not the most desirable approach since it is quite expensive and does not necessarily insure good solderability.

In order to insure good solderability, such circuit boards have been subjected to a process whereby the board is either dipped, sprayed or floated in a bath of molten solder. With proper cleaning, fluxing, etc., such processes have resulted in circuit boards having better conductivity and solderability characteristics. However, such processes have inherently produced thin, non-uniform deposits of solder in the conductive areas to the extent that the board may be totally unusable. Such processes have proven especially ineffective with regard to the conductive holds inasmuch as the holes are generally left filled with solder thus preventing the ultimate insertion of the circuit components through such holes.

In an attempt to overcome these deficiencies, it has been proposed to subject the circuit boards to a coating of solder either by dipping or by spraying followed by either a spinning or slinging operation to level the uneven solder coating through the centrifugal forces thus generated. While such approaches have yielded somewhat effective results, the centrifugal forces acting on the boards and solder thereon are necessarily non-uniform across the area of the board. This non-uniformity of forces inherently results in non-uniform thicknesses of the solder coatings with a particularly undesirable non-uniformity occuring within the holes of the circuit boards. That is, the centrifugal forces exerted within the holes coupled with surface tension action causes a large build-up of solder on one side of the hold to the extent that the hole may become completely clogged. In addition, this approach has resulted in very thin solder coatings.

Another attempt at producing uniform, thick coatings of solder on circuit boards has involved the use of a hot oil spray which is directed onto the circuit boards, after solder coating, to level and remove excessive portions of solder. Such hot oil spray, which is maintained at a temperature substantially above the melting point of the solder, acts as a liquid squeegee to level irregularities in the solder coating. Still another approach is to draw the circuit boards through a hot oil bath after exposing the circuti boards to a solder bath. Such approaches, while being somewhat successful in producing thin coatings of solder with some degree of uniformity, are generally ineffective in producing heavier coatings with any degree of uniformity, especially in the more critical areas such as holes. The thin coatings result in rapid copper oxidation and accordingly short shelf life. Even with thin coatings a certain amount of sag is experienced especially within the holes due to gravitational forces, thus resulting in a smaller size hole at one side than at the other.

SUMMARY OF THE INVENTION

Accordingly, it is an object of the present invention to obtain thick, uniform controlled coatings of solder on the conductive areas of circuit boards.

It is another object of the present invention to provide apparatus for obtaining thick, uniform controlled coatings of solder on the conductive areas of circuit boards.

It is still another object of the present invention to provide apparatus for obtaining uniform controlled coatings of solder on the conductive areas of circuit boards in which the deposition of solder may be uniformly controlled to a desired thickness while maintaining close tolerances in critical areas.

It is yet another object of the present invention to provide apparatus for obtaining substantially uniform coatings of solder on the conductive areas of circuit boards of substantially heavy thicknesses without being adversely affected by gravitational force effects on the solder deposits.

It is yet a further object of the present invention to provide automated apparatus for obtaining substantially uniform controlled thicknesses of coatings of solder on the conductive areas of circuit boards.

The foregoing and other objects of the invention are achieved by apparatus which includes means for cleaning a circuit board by immersing the circuit board in an acid solution and subsequently exposing the circuit board to solder flux, means for contacting the circuit board with molten solder, means for immersing the circuit board in a pool of a substance that is immiscible with the solder and heated to produce flowability of the solder, means for vibrating the circuit board in an orbital motion while it is within the pool to obtain substantially thick, uniform deposits of solder, means for withdrawing the circuit board from the pool, and means for cooling the circuit board. The orbital motion of the circuit board, which may be either circular or elliptical, may be continued while the circuit board is being withdrawn from the pool. Vibrating the circuit board while it is immersed in the heated pool can be performed immediately after the circuit board is contacted with the molten solder or may be performed substantially after the solder coating provided that the solder-coated circuit board is clean when it is subjected to the orbital motion while submerged in the heated pool.

Other objects of the invention will become readily apparent to those skilled in the art in view of the following detailed disclosure and description thereof, especially when read in conjunction with the accompanying drawings.

DETAILED DESCRIPTION OF THE PREFERRED EMBODIMENTS

The apparatus as contemplated by the present invention includes means for cleaning the circuit board. Cleaning is achieved by contacting the circuit board with a solution of acid at ambient temperature, rinsing the circuit board with cold water to neutralize any excess acid, and subsequently contacting the circuit board with solder flux. In addition to its cleaning action, the solder flux prepares the copper on the circuit board for the forthcoming flow of molten solder over the copper.

Following preheating, means are provided for coating the circuit board on both planar surfaces with molten solder, preferably by spraying the solder onto the circuit board. The solder-coated circuit board is next immersed in a heated pool of a substance that is immiscible with the solder, such as a pool of wax or oil. It is preferred that areas of the circuit board be solder-coated immediately prior to these areas being immersed in the pool. Accordingly, areas of the circuit board already coated with solder may be immersed in the pool while other areas of the circuit board are being coated with solder and still other areas are awaiting solder coating. It is also contemplated that the entire circuit board may be sprayed, or otherwise coated, with solder before any area of the circuit board is immersed in the pool.

Additional means are provided for vibrating the circuit board in an orbital motion while it is in the pool. Preferably the orbital motion is circular, although the orbital motion may be elliptical. Following removal from the pool, the circuit board is rinsed with water and then dryed. The orbital motion of the circuit board may be continued while the circuit board is being withdrawn from the pool.

Figure 1:
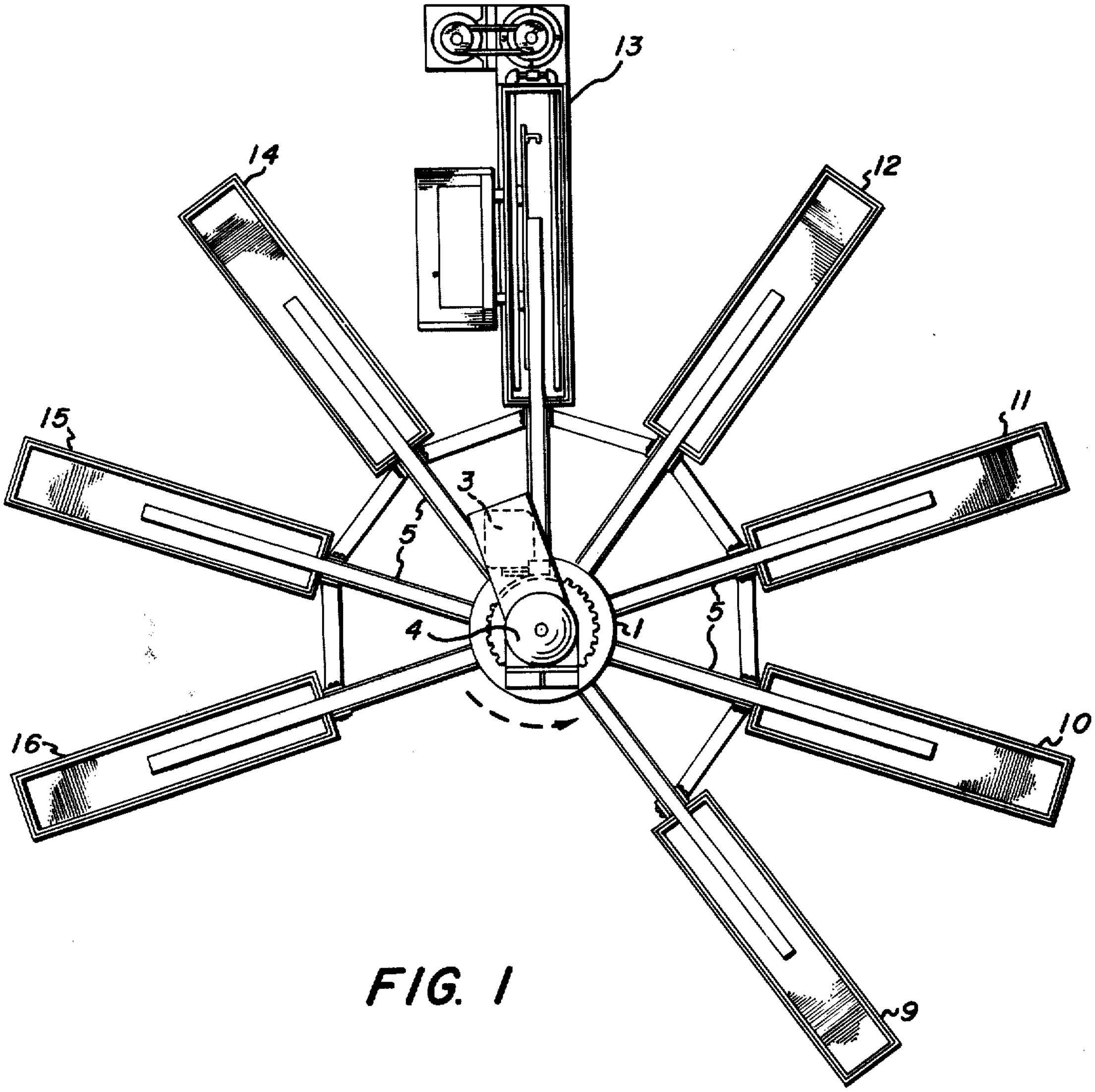
FIG. 1 is a top plan view showing one embodiment of the automated solder coating apparatus contemplated by the present invention.
Figure 2:
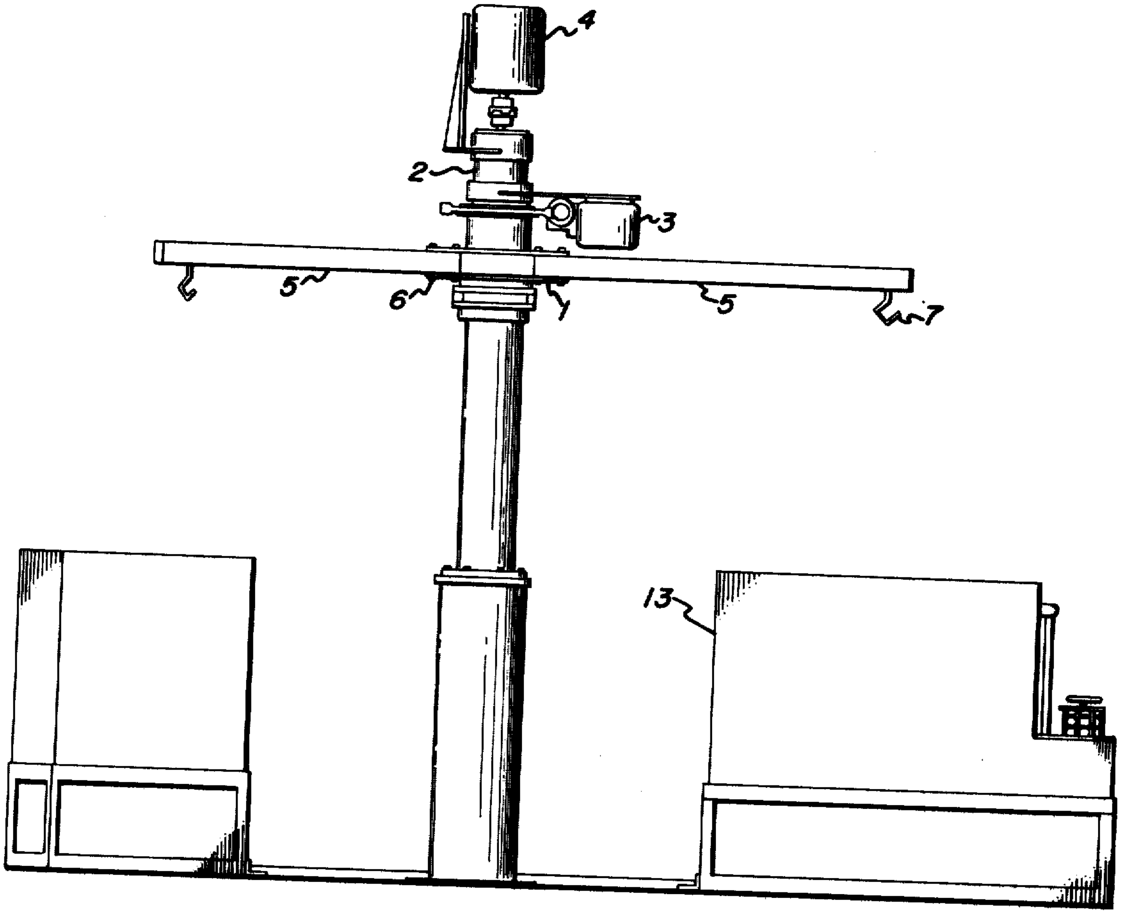
FIG. 2 is a front elevation view of the embodiment of automated solder coating apparatus illustrated in FIG. 1.

The apparatus is best understood by referring first to FIGS. 1 and 2 of the drawings. As illustrated therein, an indexing plate 1 is rotatably mounted on a vertical shaft 2. Rotation of plate 1, into the plurality of circumferential positions required, is provided by an indexing motor 3. A motor 4, mounted atop the shaft 2, controls the vertical positions of shaft 2 and, accordingly, the vertical positions of indexing plate 1. Control means (not shown) are coupled to both motors 3 and 4 for moving the indexing plate through the vertical and circumferential positions required of the apparatus. The control means may also include a monitor or control panel for monitoring and controlling specific conditions, such as, temperatures and fluid levels necessary for the solder-coating.

A plurality of horizontal mounting arms 5 are secured to indexing plate 1 by means of bolts 6. Each mounting arm 5 has a hook 7 attached thereto for hangably supporting a printed circuit board transport frame. A plurality of tanks 9 through 16, preferably made of mild carbon steel, stainless steel, or polypropylene, are situated below the outer extremities of mounting arms 5. Each arm 5 transports a single circuit board mounted in a transport frame, such as frame 8 of FIGS. 4–6, through the entire solder coating process. Although the tanks 9 through 16 are shown located about 36° apart, that separation is not critical, and the tanks may be in a different angular relationship or may be in a row provided that control of the indexing system is changed accordingly.

As indicated by the arrow in FIG. 1, indexing plate 1 is driven by motor 3 in a counter-clockwise direction such that the solder coating process starts at tank 9 and moves sequentially through tanks 10 through 16. The space between tanks 9 and 16 may be used for loading and unloading circuit boards and the aforementioned control panel. Particular attention is directed to tank 13 which is specifically designed, as will be explained in detail hereinafter, to provide a circuit board with a liquid solder spray and a subsequent orbital motion or rotation, the orbital motion to be performed while the circuit board is immersed in a heated pool of a substance that is immiscible with the solder.

After a circuit board transport frame is mounted on one of the hooks 7, the circuit board is rotated and lowered into bright dip tank 9 which contains a static solution of acid, preferably, a 15 percent solution of phosphoric acid or, alternatively, a 15 percent solution of hydrochloric acid. The acid solution, which is at ambient temperature, chemically cleans the copper surfaces of the circuit board of copper oxides and other contaminents which may have formed thereon due to exposure of the circuit board to the atmosphere. If allowed to remain, the oxides would corrupt soldering. Since the apparatus shown in FIGS. 1 and 2 is designed to solder-coat a plurality of circuit boards simultaneously, the time a circuit board spends in each tank is the same, about 15–20 seconds for each tank, as will be explained hereinafter. If it is desirable to change the time that the circuit board is in tank 9, the concentration of acid in tank 9 may be adjusted accordingly.

Next, the board is lowered into tank 10 wherein the circuit board is subjected to a cold (ambient) water spray, a spray having a force of between 40 and 60 pounds per square inch being sufficient. The cold water neutralizes and removes any acid remaining on the circuit board from tank 9.

The circuit board is lowered next into tank 11, which contains solder flux. The flux, which is at ambient temperature, can be any acid flux or an organic matter, water soluable flux, such as, for example, a conventional rosin flux. The flux prepares the copper on the board to assist the forthcoming flow of liquid solder over the copper, and performs a mild cleaning action to remove contaminents, such as, acids and oils, which might corrupt the adhesion between the copper and the solder. In the case of a water soluable flux, water may be added depending upon process time. After the flux treatment, the circuit board is preheated in tank 12 to bring the circuit board temperature up to about 250° Fahrenheit. Any conventional heating means (not shown) may be provided, the wattage required for the heating depending upon such factors as the size of the circuit board and its thickness. This preheating eliminates thermal shock when the circuit board is exposed to molten solder at about 425° Fahrenheit, and helps eliminate delamination of the circuit board.

Figure 3:
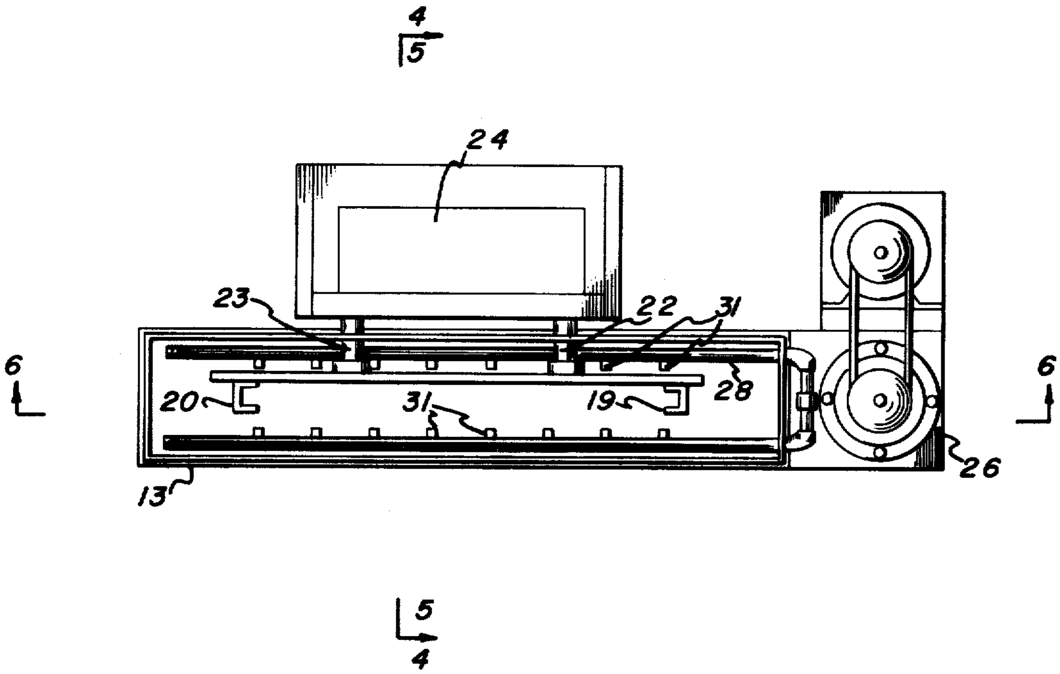
FIG. 3 is a top plan view of one embodiment of solder coating apparatus contemplated by the present invention.
Figure 4:
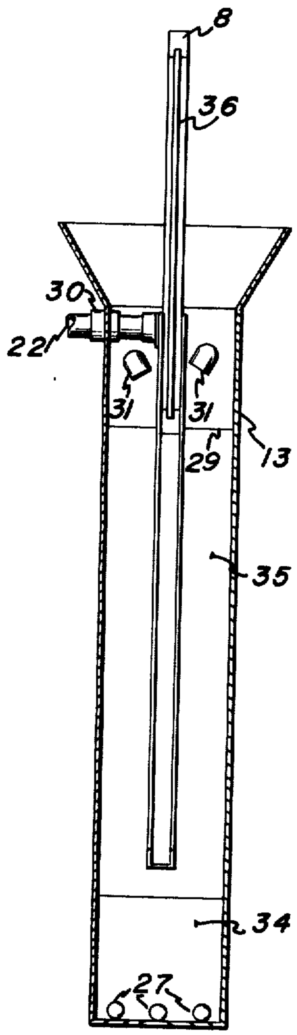
FIG. 4 is a cross sectional view taken along the lines 4—4 of FIG. 3 illustrating solder coating.
Figure 5:
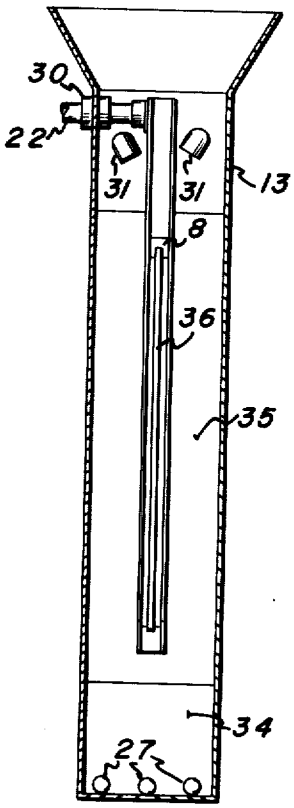
FIG. 5 is a cross sectional view taken along the lines 5—5 of FIG. 3 illustrating solder leveling.

Following heating, the circuit board is lowered into solder dip tank 13. As shown in FIG. 3, the circuit board is lowered between steel support channels or tracks 19 and 20 which are generally U shaped, each having a groove extending longitudinally thereof. The channels are mounted on a steel backing plate 21 by means (not shown) such that the grooves face each other. Preferably, the plate 21 has a plurality of rows of mounting holes such that the distance between the channels can be changed, by moving either or both channels, to accommodate circuit boards of different widths. The upper end of tank 13 is fan-shaped to facilitate entry of the circuit board transport frame 8 into tank 13 and for guiding the frame 8 between channels 19 and 20. Plate 21 is supported by rods or crank pins 22 and 23 which have their longitudinal axes transverse to the plane of plate 21. Rods 22 and 23, with appropriate seals 30, extend through a wall of tank 13, as shown in FIGS. 4 and 5. As will be explained in detail hereinafter with reference to FIG. 7, the rods 22 and 23 are rigidly connected to and driven by shafts 41 and 42 of a motor 24, the axes of shafts 41 and 42 being eccentric with the axes of rods 22 and 23 such that rotation of shafts 41 and 42 imparts an orbital motion of rotation to plate 21, and, hence, to a circuit board supported between channels 19 and 20.

A heater (not shown) extends through tank 13 near the bottom thereof to provide a source of heat for liquifying the solder pool or bath 34 contained in tank 13. A particular heater which has been used successfully is a 6 kilowatt heater with a 20 watt surface density. The power dissipated by the heater is regulated by suitable controls, for example, part of the control panel previously mentioned, to maintain the solder in the tank at a suitable operating temperature. As will be explained hereinafter, this temperature should be substantially above the melting temperature of the solder. Preferably, the solder in pool 34 is a eutectic solder, a 63 percent tin — 37 percent lead solder has been found satisfactory.

Figure 6:
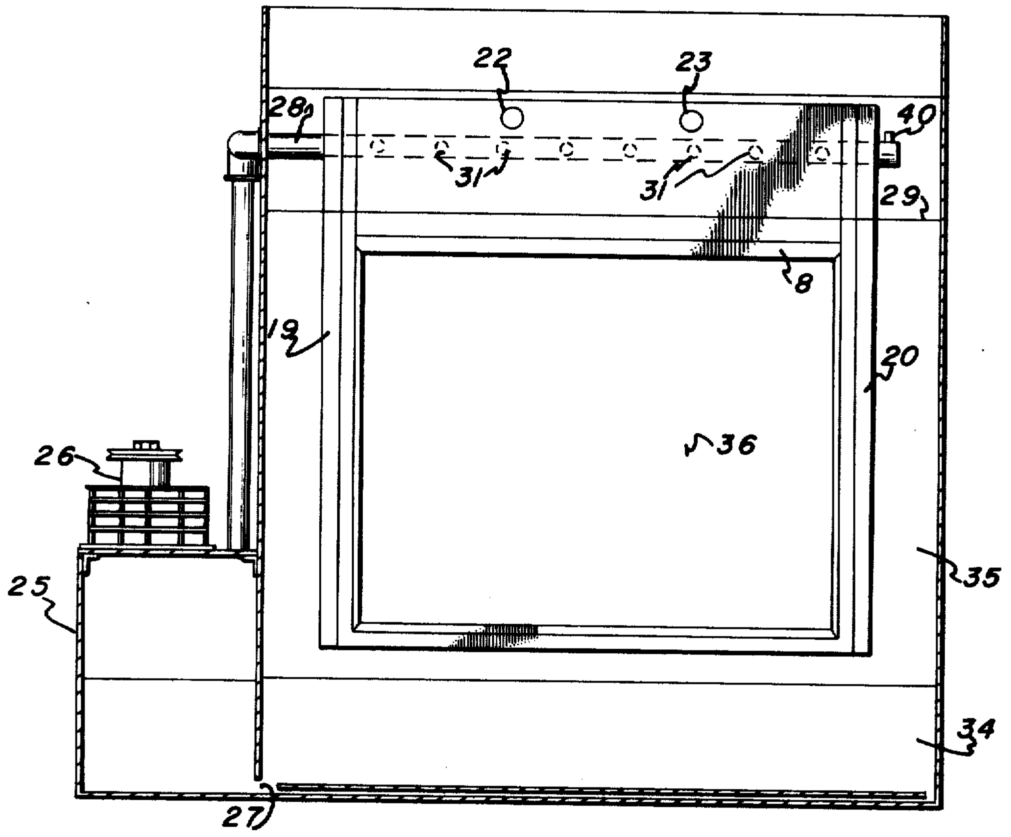
FIG. 6 is a cross sectional view of the embodiment of the solder coating apparatus of FIG. 3 taken along the lines 6—6 of FIG. 3.

A pump 26 is mounted atop an extended portion 25 of tank 13, as best seen in FIG. 6. Portion 25 of tank 13 communicates with the main portion of tank 13 by an opening or series of holes 27, in a side wall of tank 13. The pump 26, which is of conventional manufacture, such as, Ruthman Machinery Company Model 9075-M, connects with pipelines 28. Channels 19 and 20 are positioned between pipelines 28 with the pipelines extending longitudinally to channels 19 and 20 at the upper end thereof. Pipelines 28 are of sufficient length to extend between and slightly beyond channels 19 and 20, terminating between channel 20 and the adjacent sidewall of tank 13. Mounted on each of the pipelines 28 at the terminal end thereof is a solder valve 40 which opens or closes the pipeline at the terminal end.

A plurality of solder spray nozzles are located along pipelines 28. Nozzles 31 are oriented towards channels 19 and 20 and downward, preferably at an angle of about 75° to the longitudinal axis of channels 19 and 20, this is, 75° to the plane of the circuit board being soldercoated. It is preferred that the solder spray from one row of nozzles 31 contact the circuit board along a line just slightly above the line or area along which the solder spray from the other row of nozzles 31 contacts the circuit board. The spray pattern produced by the nozzles 31 is preferably cone-shaped or fan-shaped, with a preferred nozzle orifice diameter of 5/32 inches and a preferred spray pattern of 80° at 40 pounds per square inch pressure. With a spray pattern of 80°, the nozzles are located every 2 inches along the pipelines 28. Suitable nozzles are Spraying Company Systems, Vee jet nozzles number H 1/8 U 8040. Additional nozzles may be positioned to provide an upwardly directed solder spray in order to ensure complete coverage of the copper on the circuit board by the molten solder.

Also contained in tank 13 is a pool or bath 35 of a liquid that is immiscible with the solder, preferably a wax. The wax is preferably water soluable, such as, for example a polyethylene oxide wax produced by DIXCO, or a wax selected from the glycol family of waxes, such as, for example, polyethylene glycol. Although not preferred, an oil, such as common peanut oil, can be used as the pool 35. The upper level 29 of the pool 35 is maintained such that an entire circuit board may be completely immersed in the pool, and a vertical space of about one inch between the top of pool 35 and nozzles 31 is suggested.

Prior to the time that a circuit board enters channels 19 and 20, the valves 40 are open and the liquid solder pumped from pool 34 and flowing in pipelines 28 is returned to pool 34 by falling between channels 20 and the adjacent side wall of tank 13. This continuous circulation of the solder prevents dross, the scum that forms on the surface of stagnant molten metal, and maintains the solder pool 34 at a uniform temperature. With valves 40 open, there is insufficient pressure in pipelines 28 to force solder out of nozzles 31. When the circuit board 36, transported by frame 8, begins to enter channels 19 and 20, at a preferred rate of 4 inches per second, a conventional switch (not shown) is activated which causes the stem valves of solder valves 40 to close the terminal ends of pipelines 28.

Closure of the terminal ends of pipelines 28 causes the pressure in the pipelines 28 to increase, causing hot liquid solder to be forced through nozzles 31 and onto both planar surfaces of circuit board 36. The solder is preferably at a temperature of 425° Fahrenheit, although a temperature range between 400° and 440° Fahrenheit would be suitable. The temperature of solder pool 34 can be monitored by sensing the temperature of wax pool 35 which is heated by solder pool 34 and the continuously circulating solder. Upon initiation of solder-coating, both wax pool 35 and solder pool 34 are heated to the preferred temperature of 425° Fahrenheit. A eutectic solder, such as the 63 percent tin — 37 percent lead solder previously mentioned, is preferably used as pool 34 since such solders set up immediately when removed from a heat source. Supplies of wax and solder (not shown) are arranged to be fed into the tank 13, as required. Automatic level control valves (not shown) which are responsive to the fluid levels of the respective pools 34 and 35 in tank 13 may be used to keep the pools at a desired level. FIG. 4 illustrates the soldering when a lower portion of circuit board 28 is being solder sprayed.

The circuit board 36 is lowered into tank 13 until the entire circuit board has been solder coated on both planar surfaces and the circuit board is completely submerged in pool 35, as shown in FIG. 5. When the circuit board 36 reaches a point at or near the bottom of channels 19 and 20, a switch, such as a conventional cam switch (not shown), causes motor 24 to be energized, and valves 40 to open whereby the pressure in pipelines 28 is decreased such that solder no longer issues from nozzles 31. It is understood that separate switch may be used for energizing motor 24 and opening valves and that these two events need not occur simultaneously, although it is imperative that valves 40 not open until the entire circuit board 28 has passed the areas sprayed by nozzles 31. Due to the eccentricity of the axes of rods 22 and 23 and the axes of shafts 41 and 42 of motor 24, as will be explained hereinafter in detail in relation to FIG. 7, rotation of rods 22 and 23 cause plate 21 and, hence, the circuit board 36, to rotate orbitally. By orbital rotation it is meant that each hole in the board 26 is moving about the center point of that hole in an orbital manner. As used herein orbital rotation includes both elliptical orbits and circular orbits. In an orbital motion or rotation, the axis of rotation is constantly changing. This is, of course, not equivalent to rotating or spinning a mass or circuit board about a fixed axis. Although it is preferred to orbitally rotate two rods attached to support plate 21, a single orbitally driven rod could also be used. However, with one orbitally driven rod there tends to be a substantially linear motion at one extremity of the circuit board with a resulting non-uniformity of solder disposition at that end. The orbital rotation or motion of circuit board 36 while it is submerged in pool 35 lasts for a time sufficient to produce flowability of the solder, about 15–20 seconds is preferred. After this time, the orbital motion ceases, by the action of the cam switch, and the circuit board 36 is lifted from the tank 13 at a preferred rate of 4 inches per second. In some cases, it may be desirable to continue the orbital motion of board 36 while it is being lifted from pool 35.

With conventional apparatus it is only possible to deposite solder with thicknesses of from 30 to 40 millionths of an inch. With these thicknesses, the copper has a tendency over a period of time to "bleed through" the solder, resulting in the formation of undesirable copper oxides on the board. The orbital motion or rotation of the circuit board 36 in heated pool 35 helps distribute the solder uniformly throughout any holes in the board. Tests have shown that the apparatus described herein produces solder deposits that are at least 300 to 400 millionths of an inch thick, an order of magnitude increase over conventional methods, and sometimes 1,000 millionths of an inch thick, an increase of almost two orders of magnitude over conventional apparatus. The increased thickness of the solder layer practically obviates the problems of copper "bleed through," thereby increasing almost indefinitely the shelf life of solder coated copper circuit boards.

Figure 7:
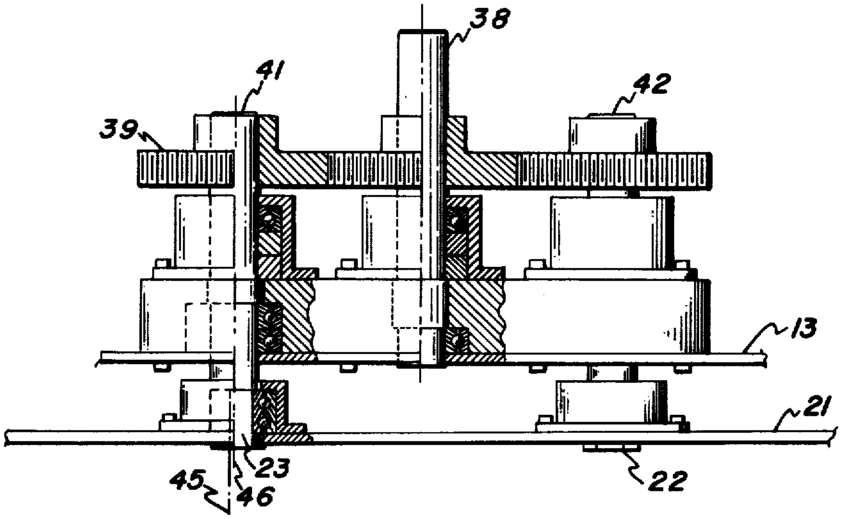
FIG. 7 shows the details of the means for orbiting plate 21.

Referring now to FIG. 7, main driven shaft 38 of motor 24 is coupled through gear train 39 to shafts 41 and 42 which are mounted on suitable bearing. Rods or crank pins 22 and 23, which have a circular cross-section, are connected rigidly to shafts 41 and 42, respectively, which also have a circular cross-section, with the center line 45 or rod 22 being offset slightly from the center line 46 of shaft 41. The center line of rod 23 is similarly offset from the center line of shaft 42. An offset of 1/16 inch has been found satisfactory, this eccentricity resulting in the plate 21 and, hence, circuit board 36, having a substantially circular orbit of ⅛ inch diameter. To provide other orbital rotations, such as an elliptical orbit, each of the shafts 41 and 42 of the motor 24 may be provided with an elliptical channel or track with the rods 22 and 23 mounted within the respective channels or tracks such that they move in an elliptical orbit. An orbit speed of 1,725 revolutions per minute has been found satisfactory, but other orbit speeds will also produce satisfactory results.

Returning to FIG. 1, after leaving tank 13, the circuit board is subjected to a water reflow rinse in tank 14, with the water at 150° Fahrenheit, and a water spray rinse in tank 15, with the water at 120° Fahrenheit. The board is then dryed in tank 17 by a high velocity air flow at ambient temperature to complete the soldering.

While the present invention has been described with reference to a preferred arrangement, it is understood that various changes may be made and equivalents may be substituted without departing from the true spirit of the invention as defined in the appended claims.

What is claimed is:

1. Apparatus for obtaining a uniform coating of solder on the conductive areas of a printed circuit board comprising:

a tank having a first pool of molten solder and a second pool of a substance that is less dense than said solder and immiscible therewith floated on top of said pool of molten solder and in contact therewith, first means associated with said tank for contacting the conductive areas of said printed circuit board with molten solder from said first pool, second means for moving said board downwardly past said first means to immerse said board in said second pool, and upwardly to remove board from said second pool, and third means for vibrating said circuit board within said second pool in an orbital motion.

2. The apparatus of claim 1 wherein said substance of said second pool is a wax at a temperature substantially above the melting temperature of said solder.

3. The apparatus of claim 1 wherein said temperature is between 400° and 440° F and said circuit board is vibrated in said second pool for between 15 and 20 seconds.

4. The apparatus of claim 1 wherein said third means includes a motor having an eccentric drive system.

5. The apparatus of claim 1 wherein said first means includes two rows of spray nozzles situated above said pool, said circuit board being lowered between said rows of nozzles.

6. Apparatus for obtaining a substantially uniform coating of solder on the conductive areas of a printed circuit board comprising:

a tank having a first pool of molten solder and a second pool of a substance that is less dense than said solder and immiscible therewith floated on top of said pool of molten solder and in contact therewith, first means associated with said tank for contacting said circuit board to be coated with molten solder from said first pool to coat the conductive areas thereof with solder, second means for moving said board downwardly past said first means to immerse the coated circuit board in said second pool and for removing said circuit board upwardly from said second pool, and third means for vibrating said circuit board in an orbital motion while said circuit board is within said second pool and while said circuit board is being removed from said second pool.

7. The apparatus of claim 6 wherein said third means includes a motor having an eccentric drive system.

8. The apparatus of claim 6 wherein said first means includes two rows of nozzles situated above said pool, said circuit board being lowered between said rows of nozzles.

9. Apparatus for obtaining a substantially uniform coating of solder on the conductive areas of a printed circuit board comprising:

a tank having a first pool of molten solder and a second pool of a substance that is less dense than said solder and immiscible therewith floated on top of said pool of molten solder and in contact therewith, first means for immersing said circuit board into said second pool and for removing said circuit board from said second pool, second means associated with said tank for spraying said circuit board with solder from said first pool only while said circuit board is being lowered into said second pool, and third means for vibrating said circuit board in an orbital motion while said circuit board is within said second pool.

10. The apparatus of claim 9 wherein said second means includes two rows of spray nozzles situated above said said pools, and valve means communicating with said rows of nozzles for terminating said spraying when said circuit board is immersed in said second pool.

11. The apparatus of claim 10 wherein said third means includes a motor having an eccentric drive system.

12. The apparatus of claim 11 where said third means further includes means for supporting said circuit board while it is immersed in said second pool, said support means being coupled to said eccentric drive system.

13. The apparatus of claim 9 wherein said orbital motion is circular.

14. Apparatus for obtaining a substantially uniform coating of solder on the conductive areas of a printed circuit board comprising:

a plurality of tanks, a first group of said tanks being provided with substances for cleaning said circuit board prior to solder coating, a second group of said tanks being provided with substances for washing and drying said circuit boards after solder coating, an additional tank having therein a first pool of molten solder and a second pool of a substance that is less dense than said solder and immiscible therewith floated on top of said pool of molten solder and in contact therewith, first means for lowering said circuit board successively into said first group of tanks, said second pool of said additional tank and said second group of tanks, second means associated with said additional tank for spraying said circuit board with solder from said first pool while said circuit board is being lowered in said second pool, and third means for vibrating said circuit board in an orbital motion while said circuit board is within said second pool.

15. The apparatus of claim 14 wherein said third means includes a motor having an eccentric drive system.

16. The apparatus of claim 15 wherein said second means includes two rows of nozzles situated above said pools, said circuit board passing between said rows of nozzles.

17. The apparatus of claim 16, wherein said third means further includes means for supporting said circuit board while in said second pool, said supporting means being coupled to said eccentric drive system.

18. The apparatus of claim 17 wherein one of said first group of tanks contains an acid solution and another of said first group of tanks contains solder flux.

19. The apparatus of claim 18 wherein at least one of said second group of tanks provides the solder circuit board with a hot water bath.

* * * * *

UNITED STATES PATENT AND TRADEMARK OFFICE

CERTIFICATE OF CORRECTION

PATENT NO. : 3,893,409

DATED : July 8, 1975

INVENTOR(S) : Everett Arthur Rote

It is certified that error appears in the above-identified patent and that said Letters Patent are hereby corrected as shown below:

Column 8, line 61, after "remove" insert --said--.

Signed and Sealed this

*tenth* Day of *February 1976*

[SEAL]

*Attest:*

RUTH C. MASON
*Attesting Officer*

C. MARSHALL DANN
*Commissioner of Patents and Trademarks*